(12) United States Patent
Lin et al.

(10) Patent No.: US 9,219,106 B2
(45) Date of Patent: Dec. 22, 2015

(54) INTEGRATED INDUCTOR

(75) Inventors: Yen-Liang Lin, Taichung (TW);
Mirng-Ji Lii, Sinpu Township (TW);
Chen-Shien Chen, Zhubei (TW);
Ching-Wen Hsiao, Banqiao (TW);
Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 25 days.

(21) Appl. No.: 13/198,783

(22) Filed: Aug. 5, 2011

(65) Prior Publication Data
US 2013/0032923 A1 Feb. 7, 2013

(51) Int. Cl.
*H01L 27/08* (2006.01)
*H01L 49/02* (2006.01)
*H01L 23/522* (2006.01)
*H01L 23/00* (2006.01)

(52) U.S. Cl.
CPC ............ *H01L 28/10* (2013.01); *H01L 23/5227* (2013.01); *H01L 24/05* (2013.01); *H01L 24/13* (2013.01); *H01L 2224/0346* (2013.01); *H01L 2224/0401* (2013.01); *H01L 2224/05024* (2013.01); *H01L 2224/05147* (2013.01); *H01L 2224/05553* (2013.01); *H01L 2224/05554* (2013.01); *H01L 2224/05555* (2013.01); *H01L 2224/05572* (2013.01); *H01L 2224/05649* (2013.01); *H01L 2224/05655* (2013.01); *H01L 2224/05657* (2013.01); *H01L 2224/1145* (2013.01); *H01L 2224/11334* (2013.01); *H01L 2224/11462* (2013.01); *H01L 2224/11849* (2013.01); *H01L 2224/13006* (2013.01); *H01L 2224/13111* (2013.01); *H01L 2224/13139* (2013.01); *H01L 2224/13147* (2013.01); *H01L 2924/01029* (2013.01)

(58) Field of Classification Search
CPC ..................................................... H01F 27/24
USPC .......... 257/421, 422, 424, 428, 531; 336/200; 438/107, 381, 393, 613
See application file for complete search history.

(56) References Cited

U.S. PATENT DOCUMENTS

| 5,874,883 | A * | 2/1999 | Uemura et al. | 336/200 |
|---|---|---|---|---|
| 6,815,327 | B2 * | 11/2004 | Farnworth | 438/614 |
| 7,538,653 | B2 * | 5/2009 | Schrom et al. | 336/200 |
| 7,727,879 | B2 * | 6/2010 | Lin et al. | 438/622 |
| 8,198,965 | B2 * | 6/2012 | Schrom et al. | 336/83 |
| 2002/0111009 | A1 * | 8/2002 | Huang et al. | 438/613 |
| 2004/0004266 | A1 * | 1/2004 | Furumiya et al. | 257/528 |
| 2008/0238599 | A1 * | 10/2008 | Hebert et al. | 336/110 |
| 2010/0244188 | A1 * | 9/2010 | Mihara | 257/531 |
| 2010/0264516 | A1 * | 10/2010 | Lin et al. | 257/531 |

* cited by examiner

*Primary Examiner* — Shaun Campbell
*Assistant Examiner* — Ismail Muse
(74) *Attorney, Agent, or Firm* — Slater & Matsil, L.L.P.

(57) ABSTRACT

A system and method for providing an integrated inductor with a high Quality factor (Q) is provided. An embodiment comprises a magnetic core that is in a center of a conductive spiral. The magnetic core increases the inductance of the integrated inductor to allow the inductor to be used in applications such as a RF choke. The magnetic core may be formed in the same manner and time as an underbump metallization.

19 Claims, 8 Drawing Sheets

INTEGRATED INDUCTOR

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. One such application of an inductor may be as a choke, in which an inductor is designed to have a high inductive reactance to, or block, signals with certain frequencies in an electrical circuit while allowing passage of other signals at different frequencies in the electrical circuit. A choke may be made, for example to block a radio frequency (RF), and may be called a RF choke, which is of use in radio communications.

Traditionally, the inductance of an inductor may be increased by increasing the number of coils of conductive material around the core. However, increasing the number of coils also increases the resistance, parasitic capacitance, and especially the size of the inductor. This increase in size of the inductor has hindered the placement, use, and miniaturization of inductors onto semiconductor dies. This has also hindered the ability of inductors to be both improved by improving the inductance while also reducing the size of the inductor. As such, what is needed is an increase in an inductor's inductance while maintaining or reducing the size of the inductor and its coils.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely an integrated inductor with a magnetic material. The embodiments may also be applied, however, to other inductors.

Figure 1A:
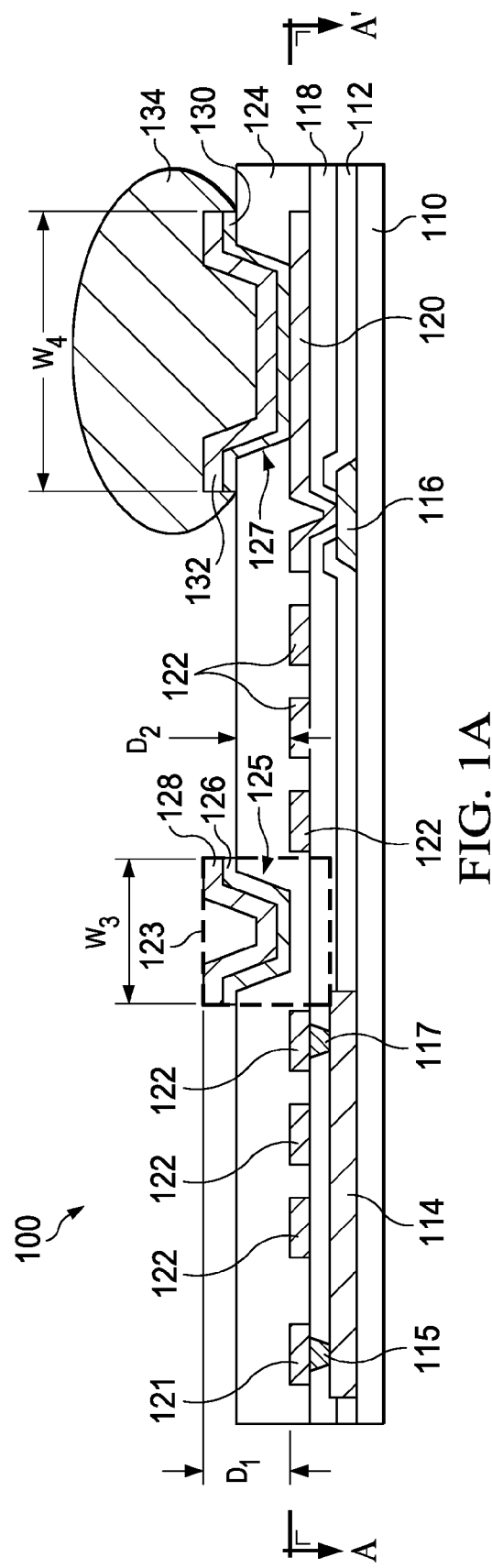
FIG. 1A illustrates a cross-sectional view of an integrated inductor below a passivation layer with magnetic material extending into the passivation layer in accordance with an embodiment.

With reference now to FIG. 1A, there is shown a portion of a semiconductor die 100 including a semiconductor substrate 110, a first passivation layer 112, a first interconnect 114, a contact pad 116, a first via 115, a second via 117, a second passivation layer 118, a post-passivation interconnect (PPI) 120, a second interconnect 121, an inductor 122, a third passivation layer 124, a magnetic core opening 125, a first seed layer 126, a magnetic core 128, a PPI opening 127, a second seed layer 130, an underbump metallization (UBM) 132, and a contact bump 134. The semiconductor substrate 110 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 110 may include active devices (not shown in FIG. 1A for clarity). As one of ordinary skill in the art will recognize, a wide variety of active devices such as transistors, capacitors, resistors, combinations of these, and the like may be used to generate the desired structural and functional requirements of the design for the semiconductor die 100. The active devices may be formed using any suitable methods.

The semiconductor substrate 110 may also include metallization layers (also not shown in FIG. 1A for clarity). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.).

The contact pad 116 may be formed over and in electrical contact with the metallization layers in order to help provide external connections to the active devices. The contact pad 116 may comprise aluminum, but other materials, such as copper, may alternatively be used. The contact pad 116 may be formed using a deposition process, such as sputtering, to form a layer of material (not shown) and portions of the layer of material may then be removed through a suitable process (such as photolithographic masking and etching) to form the contact pad 116. However, any other suitable process may be utilized to form the contact pad 116. The contact pad 116 may be formed to have a thickness of between about 0.5 µm and about 4 µm, such as about 1.45 µm.

The first passivation layer 112 may be formed on the semiconductor substrate 110 over the contact pad 116. The first passivation layer 112 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 112 may be formed through a process such as chemical vapor deposition (CVD), although any suitable process may be utilized, and may have a thickness between about 0.5 µm and about 5 µm, such as about 9.25 KÅ.

The first interconnect 114 may be formed over the semiconductor substrate 110 and within the first passivation layer 112 in order to provide an electrical connection between the inductor 122 and the second interconnect 121 (both of which are discussed further below). The first interconnect 114 may comprise copper, but other materials, such as aluminum, may alternatively be used. An opening through the first passivation layer 112 may be made in the desired location of the first interconnect 114 through a suitable process, such as a suitable photolithographic masking and etching. For example, a photoresist (not shown) may be formed on the first passivation layer 112 and may then be patterned in order to provide an opening in the first passivation layer 112. The patterning may be performed by exposing the photoresist to a radiation such as light in order to activate photoactive chemicals that may make up one component of the photoresist. A positive developer or a negative developer may then be used to remove either the exposed photoresist (for a negative development) or to remove the non-exposed photoresist (for a positive development).

Once the photoresist has been developed and patterned, the first interconnect 114 may be constructed by using the photoresist as a mask to form the opening into or through the first passivation layer 112 using, e.g., an etching process. The conductive material may then be formed into the opening into or through the first passivation layer 112, e.g., by first applying a seed layer (not shown) into and along the sidewalls of the opening. The seed layer may then be utilized in an electroplating process in order to plate the conductive material into the opening into or through the first passivation layer 112, thereby forming the first interconnect 114. The first interconnect 114 may be formed to have a thickness of between about 4 µm and about 10 µm, such as about 7 µm. However, while the material and methods discussed are suitable to form the conductive material, these materials are merely exemplary. Any other suitable materials, such as tungsten, and any other suitable processes of formation, such as CVD or PVD, may alternatively be used to form the first interconnect 114.

After the first interconnect 114 has been formed, another opening through the first passivation layer 112 to expose at least a portion of the underlying contact pad 116 may be made. This opening through the first passivation layer 112 to expose the portion of the underlying contact pad 116 allows for physical and electrical contact between the contact pad 116 and the PPI 120 (discussed further below). The opening through the first passivation layer 112 may be formed using a suitable photolithographic mask and etching process, although any other suitable process to expose portions of the contact pad 116 may alternatively be used.

However, as one of ordinary skill in the art will recognize, the above described process of forming the first passivation layer 112, the openings through the first passivation layer 112, and the first interconnect 114 are merely intended to be illustrative and are not intended to limit the embodiments. Any suitable processes or order of process steps, such as forming the opening to expose the contact pad 116 prior to forming the first interconnect 114, may alternatively be utilized and are fully intended to be included within the embodiments.

The second passivation layer 118 may be formed over the contact pad 116, the first interconnect 114, and the first passivation layer 112. The second passivation layer 118 may be formed from a polymer such as polyimide. Alternatively, the second passivation layer 118 may be formed of a material similar to the material used as the first passivation layer 112, such as silicon oxides, silicon nitrides, low-k dielectrics, extremely low-k dielectrics, combinations of these, and the like. The second passivation layer 118 may be formed to have a thickness between about 2 µm and about 15 µm, such as about 5 µm.

After the second passivation layer 118 has been formed, the first via 115 and the second via 117 may be formed over the first interconnect 114 in order to allow for physical and electrical contact to the first interconnect 114 through the second passivation layer 118. The first via 115 may be used to connect the first interconnect 114 to the second interconnect 121 (discussed further below) and the second via 117 may be used to connect the first interconnect 114 to the inductor 122 (also discussed further below). In this fashion, the inductor 122 may be connected to the second interconnect 121 through the first interconnect 114, the first via 115 and the second via 117.

The first via 115 and the second via 117 may comprise copper, but other materials, such as aluminum or tungsten, may alternatively be used. The first via 115 and the second via 117 may be formed, e.g., by forming openings for the first via 115 and the second via 117 through the second passivation layer 118 using, e.g., a suitable photolithographic mask and etching process. After the openings for the first via 115 and the second via 117 have been formed, the first via 115 and the second via 117 may be formed using a seed layer (not shown) and a plating process, such as electrochemical plating, although other processes of formation, such as sputtering, evaporation, or PECVD process, may alternatively be used depending upon the desired materials. Once the openings for the first via 115 and the second via 117 have been filled with conductive material, any excess conductive material outside of the openings for the first via 115 and the second via 117 may be removed, and the first via 115, the second via 117 and the second passivation layer 118 may be planarized using, for example, a chemical mechanical polishing process.

After the first via 115 and the second via 117 have been formed, another opening through the second passivation layer 118 to expose at least a portion of the underlying contact pad 116 may be made. The opening through the second passivation layer 118 to the underlying contact pad 116 allows for physical and electrical contact between the contact pad 116 and the PPI 120 (discussed further below). The opening through the second passivation layer 118 may be formed using, e.g., a suitable photolithographic mask and etching process, although any suitable process to expose portions of the contact pad 116 may be used.

After the contact pad 116 has been exposed, the inductor 122, the second interconnect 121, and the PPI 120 may be formed. In an embodiment the PPI 120 may be formed to extend through the second passivation layer 118 and also extend along the second passivation layer 118. The PPI 120 may be utilized as a redistribution layer to allow the UBM 132 that will be electrically connected to the contact pad 116 to be placed in any desired location on the semiconductor die 100, instead of limiting the location of the UBM 132 to a region directly over the contact pad 116.

The second interconnect 121 may be used to provide a connection to the inductor 122. In an embodiment the second interconnect may be connected to an interior coil of the inductor 122 through the first interconnect 114. Additionally, while not explicitly illustrated in the Figures, the second interconnect 121 may be utilized to connect the inductor 122 to other parts of the semiconductor die 100 such as the active devices and metallization layers within the semiconductor substrate 110. This connection may be made, for example, through vias and interconnects to the metallization layers in the semiconductor substrate 110.

The inductor 122 may be used as a passive electrical component that can store energy in a magnetic field that is created by the electric current passing from the second interconnect 121 to a center coil of the inductor 122, through the coils of the inductor 122 and exiting the inductor 122 through another connection on an outer coil, such as a via (not shown), in order to connect the outer coil to, e.g., the metallization layers. In an embodiment the inductor 122 may be a series of conductive coils, such as three conductive coils, in a plane substantially parallel to the semiconductor substrate 110, which in the cross-section of FIG. 1A appears as a series of rectangular boxes. These conductive coils of the inductor may encircle a central core region 123 of the inductor 122. The central core region 123 may be a region into which magnetic material (e.g., the magnetic core 128, discussed further below) may be placed so as to enhance the inductor's 122 Q factor. As such, while at least a part of the central core region 123 may be encircled by the conductive coils, the central core region 123 is not limited to simply the center of the conductive coils, and the central core region 123 may also extend above or below a plane which includes the conductive coils. For example, the central core region 123 may extend above the inductor 122 a first distance $D_1$ of between about 5.5 µm and about 57 µm, such as about 7 µm.

Figure 1B:
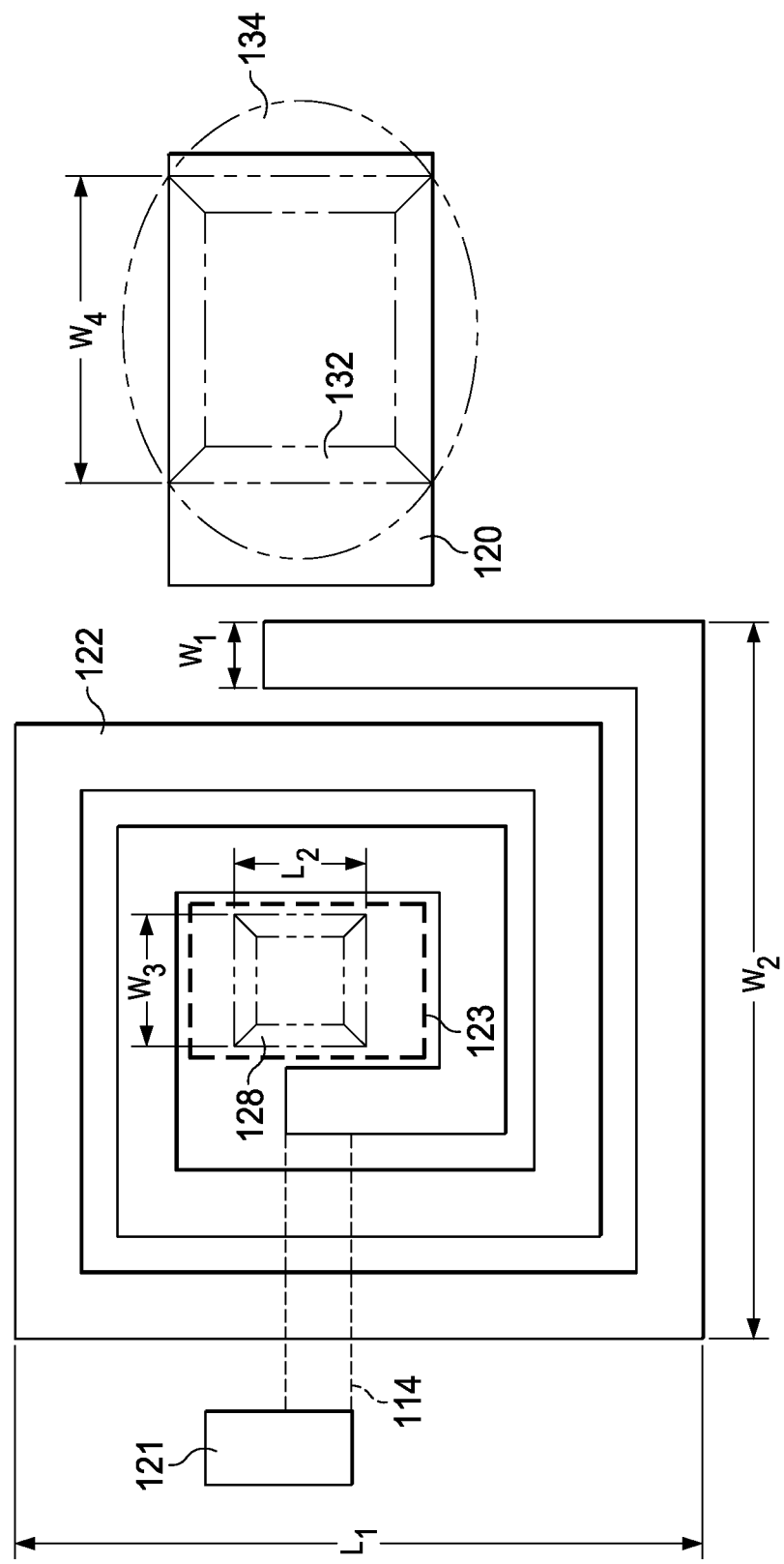
FIG. 1B illustrates a top-down view of the integrated inductor below the passivation layer with the magnetic material extending into the passivation layer in accordance with an embodiment.

FIG. 1B illustrates a top-down view of the PPI 120, the inductor 122, and the second interconnect 121 along the line A-A' in FIG. 1A. To help illustrate the relative positions of the various structures, the first interconnect 114, the magnetic core 128, the UBM 132, and the contact bump 134 are also shown in dashed lines even though they are not along the line A-A' in FIG. 1A. In this view, the inductor 122 is shown as having three conductive coils around the central core region 123. In this embodiment the conductive coils may have a first width $W_1$ of between about 5 µm and about 20 µm, such as about 10 µm, and the inductor 122 itself may have a second width $W_2$ of between about 40 µm and about 200 µm, such as about 50 µm and a first length $L_1$ of between about 40 µm and about 200 µm, such as about 50 µm.

In a specific embodiment, the inductor 122 may be used as a RF choke. A RF choke may utilize the inductor's 122 inductive reactance in order to block certain radio signal frequencies in an electrical circuit while allowing other radio signal frequencies to pass. However, as one of ordinary skill in the art will recognize the inductor 122 is not limited to being an RF choke, and any other suitable uses for the inductor 122 may alternatively be utilized while remaining within the scope of the present embodiments.

Returning now to FIG. 1A, in an embodiment the PPI 120, the second interconnect 121, and the inductor 122 may all be formed at the same time, although the PPI 120, the second interconnect 121, and the inductor 122 may alternatively be formed in separate processes and at separate times from each other. The PPI 120, the second interconnect 121, and the inductor 122 may comprise a conductive material such as copper. However, the PPI 120, the second interconnect 121, and the inductor 122, may alternatively comprise other materials, such as aluminum, and may also alternatively be comprised of different materials from each other. In an embodiment, the conductive material for the PPI 120, the second interconnect 121, and the inductor 122 may be formed by first applying a seed layer (not shown) over the second passivation layer 118. A photoresist (not shown) may then be formed and patterned in order to expose the seed layer where the PPI 120, the second interconnect 121, and the inductor 122 are desired to be located. The seed layer may then be utilized, for example, in an electroplating process in order to plate the conductive material over the seed layer, thereby forming the PPI 120, the second interconnect 121, and the inductor 122 on the second passivation layer 118 within the patterned photoresist. Once formed, the photoresist and undesired portions of the seed layer (e.g., those portions of the seed layer that were covered by the photoresist) may be removed.

Once the PPI 120, the second interconnect 121, and the inductor 122 have been formed, the third passivation layer 124, may be formed to protect the inductor 122 and the other underlying structures. The third passivation layer 124 similar to the second passivation layer 118, may be formed from a polymer such as polyimide, or may alternatively be formed of a similar material as the first passivation layer 112 (e.g., silicon oxides, silicon nitrides, low-k dielectrics, extremely low-k dielectrics, combinations of these, and the like), or any other suitable organic or inorganic passivation material. The third passivation layer 124 may be formed to have a thickness of between about 2 µm and about 15 µm, such as about 5 µm.

After the third passivation layer 124 has been formed, a PPI opening 127 through the third passivation layer 124 and a magnetic core opening 125 into the third passivation layer 124 may be made. The PPI opening 127 may be made by removing portions of the third passivation layer 124 to expose at least a portion of the underlying PPI 120, thereby allowing contact between the UBM 132 (discussed further below) and the PPI 120. The magnetic core opening 125 may be formed to extend into the third passivation layer 124 to a second distance $D_2$ of, e.g., between about 2.5 µm and about 50 µm, such as about 7 µm. The magnetic core opening 125 and the PPI opening 127 may be formed using a suitable photolithographic mask and etching process, although any suitable process to expose portions of the magnetic core opening 125 and the PPI opening 127 may alternatively be used.

Once the magnetic core opening 125 and the PPI opening 127 have been formed, the first seed layer 126 and the second seed layer 130 may be formed. In an embodiment the first seed layer 126 and the second seed layer 130 may be deposited by PVD or CVD, and may be formed of copper, although other methods and materials may alternatively be used if desired. Additionally, the first seed layer 126 and the second seed layer 130 may have a thickness of between about 50 Å and about 1,000 Å, such as about 300 Å.

The magnetic core 128 and the UBM 132 may be created over the first seed layer 126 and the second seed layer 130, respectively, by using a plating process, such as electrochemical plating, although other processes of formation, such as sputtering, evaporation, or PECVD process, may alternatively be used depending upon the desired materials. The magnetic core 128 and the UBM 132 may be may be made of Ni, NiZn, Co, or a MnBi, although other magnetic materials may be used if desired. The magnetic core 128 and the UBM 132 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the magnetic core 128 and the UBM 132 in a desired shape, such as a circular, octagonal, square, or rectangular shape.

However, as one of ordinary skill in the art will recognize, the simultaneous formation of the magnetic core 128 and the UBM 132 is merely illustrative of one method of forming the magnetic core 128 and the UBM 132 and is not intended to be limiting. Other suitable methods of formation, such as separately forming the magnetic core 128 either before or after the UBM 132, or forming the magnetic core 128 from materials different from the UBM 132, may alternatively be utilized. These and any other suitable processes or materials are fully intended to be included within the scope of the embodiments.

The magnetic core 128 may have a third width $W_3$ and the UBM 132 may have a fourth width $W_4$. In an embodiment the fourth width $W_4$ may be large enough to allow for the placement of the contact bump 134 (discussed further below), while the third width $W_3$ may be smaller than the fourth width $W_4$. By making the fourth width $W_4$ larger than the third width $W_3$, magnetic core 128 may be formed to prevent the placement of the contact bump 134, thereby helping to prevent the improper placement of the contact bump 134 onto the magnetic core 128.

As an example only, the third width $W_3$ may be between about 30 μm and about 400 μm, such as about 200 μm, while the fourth width $W_4$ may be between about 200 μm and about 800 μm, such as about 250 μm. Additionally, the magnetic core 128 may have a second length $L_2$ of between about 30 μm and about 400 μm, such as about 200 μm. However, as one of ordinary skill in the art will recognize, the above descriptions of the magnetic core 128 and the UBM 132 are merely intended to be illustrative and are not intended to be limiting, as the precise dimensions of both the magnetic core 128 and the UBM 132 may be altered while remaining within the scope of the present embodiments.

Once the UBM 132 has been formed, the contact bump 134 may be placed or formed on the UBM 132. The contact bump 134 may comprise a material such as tin, or other suitable materials, such as silver, lead-free tin, or copper. In an embodiment in which the contact bump 134 is a tin solder bump, the contact bump 134 may be placed onto the UBM 132 using a ball-drop method. Alternatively, the UBM 132 may be formed by initially forming a layer of tin through such commonly used methods such as evaporation, electroplating, printing, solder transfer, ball placement, etc, to a thickness of, e.g., about 100 μm, and then performing a reflow in order to shape the material into the desired bump shape. Any suitable method of producing the contact bump 134 may alternatively be utilized.

By forming the magnetic core 128 in the central core region 123, the magnetic core 128 can enhance the inductor's 122 Q factor without requiring the inductor 122 to be enlarged. This allows for an enhancement of the inductor 122 without jeopardizing the miniaturization of the inductor 122. Additionally, by forming the magnetic core 128 along with the UBM 132, no additional process steps and their complications are used to implement the magnetic core 128.

Figure 2A:
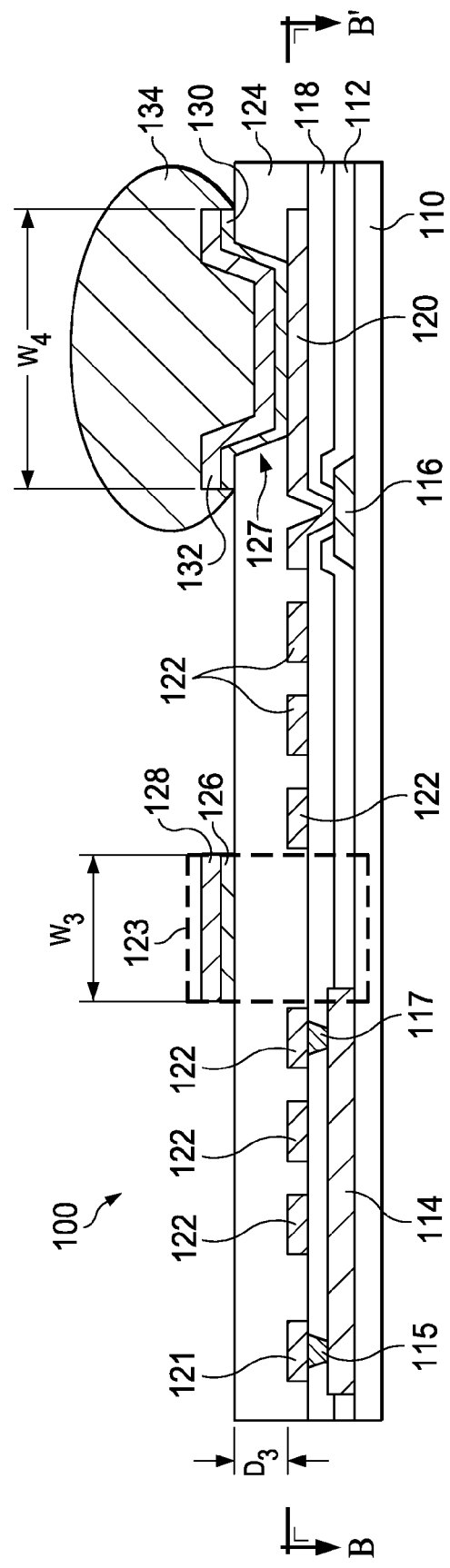
FIG. 2A illustrates a cross-sectional view of an integrated inductor below a passivation layer with magnetic material that is on top of the passivation layer in accordance with an embodiment.

FIG. 2A illustrates another embodiment in which the magnetic core 128 is formed within the central core region 123 of the inductor 122. In this embodiment, instead of forming the magnetic core opening 125 and then forming the magnetic core 128 within the magnetic core opening 125 (see FIG. 1A), the magnetic core opening 125 is not formed. As such, when the first seed layer 126, the second seed layer 130, the magnetic core 128, and the UBM 132 are formed, the first seed layer 126 and the magnetic core 128 may be formed on the top surface of the third passivation layer 124 instead of partially within the third passivation layer 124. Accordingly, the magnetic core 128 may have a planar top surface, and may be separated from the inductor 122 by a third distance $D_3$ of between about 2.5 μm and about 50 μm, such as about 7 μm. Additionally, the magnetic core 128 may also have the third width $W_3$ and the second length $L_2$.

Figure 2B:
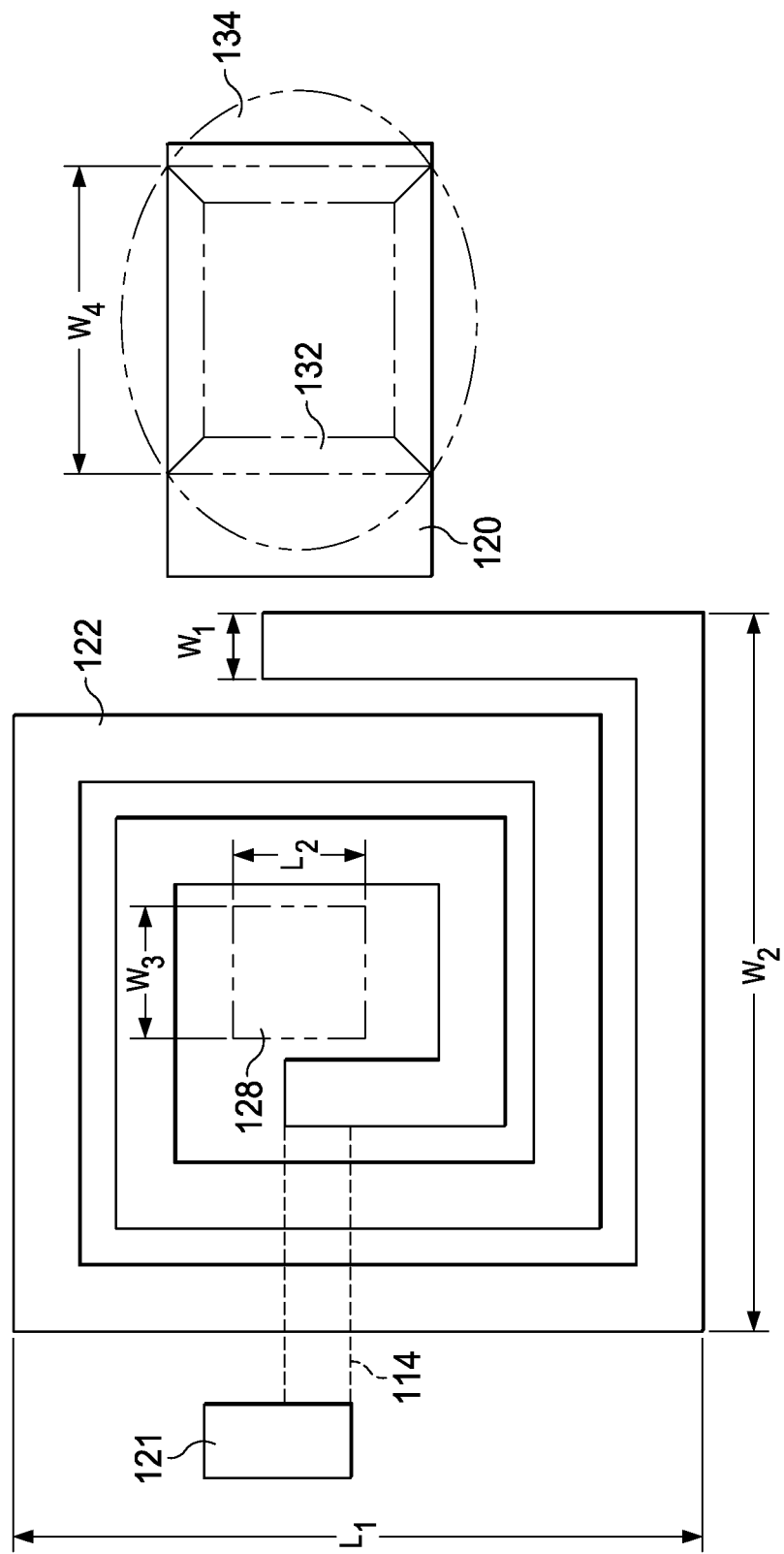
FIG. 2B illustrates a top-down view of the integrated inductor below the passivation layer with the magnetic material that is on top of the passivation layer in accordance with an embodiment.

FIG. 2B illustrates a top-down view of the embodiment illustrated in FIG. 2A, and illustrates the PPI 120, the inductor 122, and the second interconnect 121 along the line B-B' in FIG. 2A. Additionally, to illustrate the relative positions of the various components, the first interconnect 114, the magnetic core 128, the UBM 132, and the contact bump 134 are shown in dashed lines even though they are not along the line B-B' in FIG. 2A. As can be seen in this top-down view, the magnetic core 128 may have a planar top surface (as represented by the single dashed box) and may also have the third width $W_3$ which is smaller than the fourth width $W_4$ of the UBM 132.

Figure 3A:
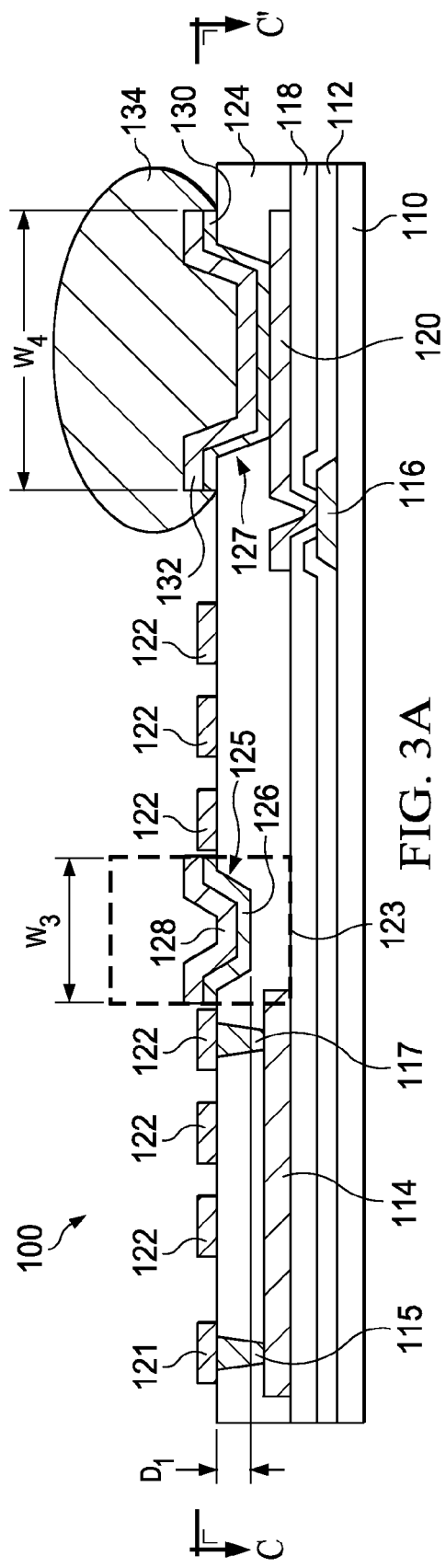
FIG. 3A illustrates a cross-sectional view of an integrated inductor that is above a passivation layer with magnetic material extending into the passivation layer in accordance with an embodiment.

FIG. 3A illustrates yet another embodiment in which the magnetic core 128 is formed within the magnetic core opening 125, but in which the inductor 122 is formed on top of the third passivation layer 124 and remains exposed without a passivation layer covering the inductor 122. In this embodiment the first interconnect 114 may be formed after the second passivation layer 118 has been formed and may be formed at the same time as the PPI 120 using, e.g., a photolithographic mask and electroplating process, although the first interconnect 114 may alternatively be formed in a separate process from the PPI 120 is desired. After the first interconnect 114 and the PPI 120 have been formed, the third passivation layer 124 may be formed over the PPI 120 and the first interconnect 114, and the first via 115 and the second via 117 may be formed through the third passivation layer 124 to connect to the first interconnect 114 using, e.g., a masking, etching, and plating process such as the process described above with respect to FIG. 1A.

After the third passivation layer 124, the first via 115, and the second via 117 have been formed, the inductor 122 and the second interconnect 121 may be formed on top of the third passivation layer 124, with the second interconnect 121 connected to the first via 115 and the inductor 122 connected to the second via 117. The inductor 122 and the second interconnect 121 may be formed from similar materials and using a process similar to the one described above for the inductor 122 and second interconnect 121 in FIG. 1A, such as an electroplating process using a photolithographic material as a plating mask. However as one of ordinary skill in the art will recognize, this description is merely illustrative and any other suitable process may alternatively be utilized.

Once the inductor 122 and the second interconnect 121 have been formed on the top surface of the third passivation layer 124, the magnetic core opening 125 and the PPI opening 127 may be formed, and the first seed layer 126, the second seed layer 130, the magnetic core 128, the UBM 132, and the contact bump 134 may be formed or placed using processes similar to those described above with respect to FIG. 1A. By forming the inductor 122 on top of the third passivation layer 124, the magnetic core 128 may be located not only in the central core region 123 but also in the center of the inductor 122, thereby helping to enhance the Q factor of the inductor 122.

However, as one of ordinary skill in the art will immediately recognize, the precise process described herein for this embodiment, and the precise order of these process steps, may be altered as desired while remaining within the scope of the embodiments. For example, the order of formation for the formation of the magnetic core 128 and the UBM 132 and the formation of the inductor 122 and the second interconnect 121 may be reversed, with the magnetic core 128 and the UBM 132 formed prior to the formation of the inductor 122 and the second interconnect 121. This alternative and any other suitable alternative are fully intended to be included within the scope of the present embodiments.

Figure 3B:
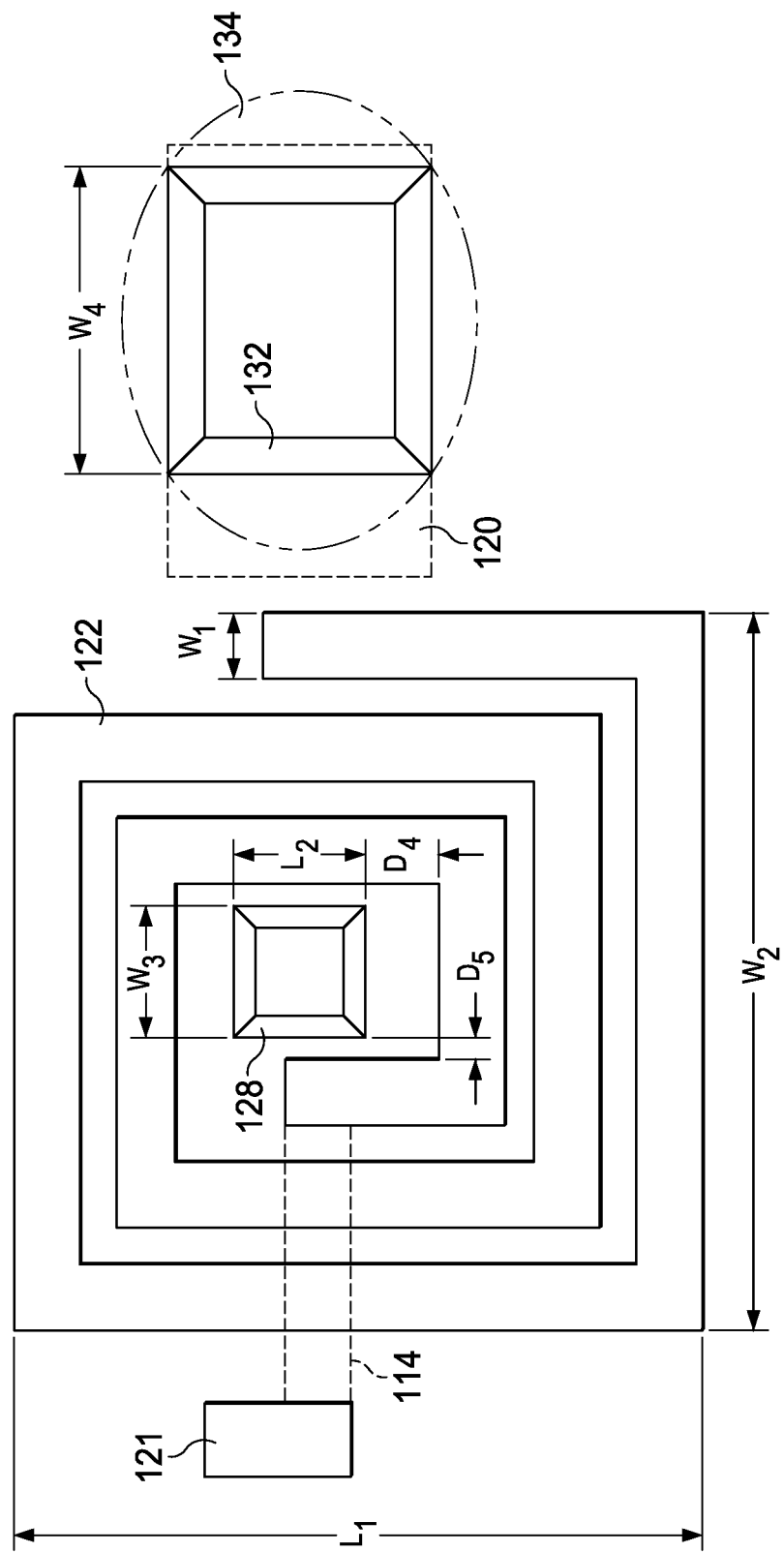
FIG. 3B illustrates a top-down view of the integrated inductor that is above the passivation layer with the magnetic material extending into the passivation layer in accordance with an embodiment.

FIG. 3B illustrates a top-down view of the embodiment illustrated in FIG. 3A along the line C-C' in FIG. 3A. As such, FIG. 3B illustrates the second interconnect 121, the inductor 122, the magnetic core 128, the UBM 132, and the contact bump 134. To illustrate the relative positions of the components, FIG. 3B also illustrates the first interconnect 114 and the PPI 120 in dashed lines even though they are not along the line C-C' in FIG. 3A. As can be seen in this top-down view, the magnetic core 128, while being in the same plane as the inductor 122 (see FIG. 3A), may be separated from the inductor 122 by a fourth distance $D_4$ in a first direction and may be separated from the inductor 122 by a fifth distance $D_5$ in a second direction. In an embodiment, the fourth distance $D_4$ may be between about 1 μm and about 20 μm, such as about 1 μm, and the fifth distance $D_5$ may be between about 1 μm and about 20 μm, such as about 1 μm.

Figure 4A:
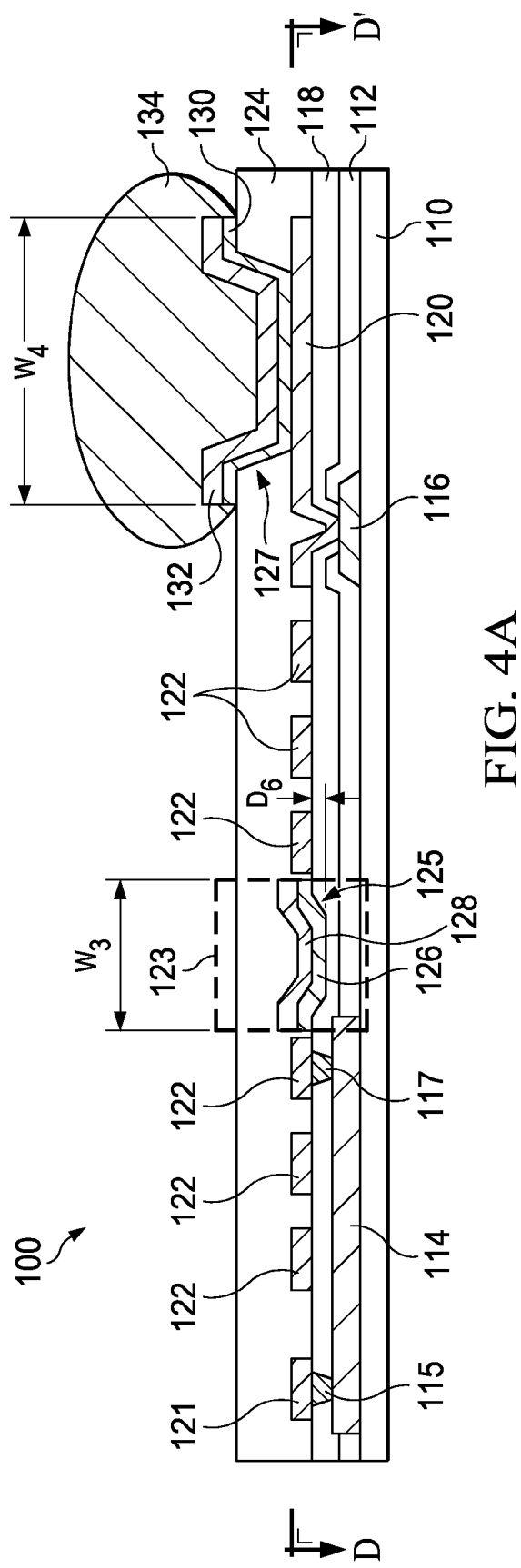
FIG. 4A illustrates a cross-section view of an integrated inductor that has a magnetic material located within the center of the integrated inductor in accordance with an embodiment.

FIG. 4A illustrates yet another embodiment of the magnetic core 128 formed within the central core region 123 of the inductor 122. In this embodiment, instead of forming the magnetic core opening 125 in the third passivation layer 124 (see FIG. 1A), the magnetic core opening 125 may be formed in the second passivation layer 118 and the first seed layer 125 and the magnetic core 128 may then be formed in the magnetic core opening 125 extending into the second passivation layer 128 using materials and processes similar to those described above with reference to FIG. 1A. In an embodiment the magnetic core opening 125 may be formed to extend into the second passivation layer a sixth distance $D_6$ between about 2.5 μm and about 50 μm, such as about 7 μm.

Once the magnetic core 128 has been formed to extend into the second passivation layer 118, the inductor 122, the second interconnect 121, and the PPI 120 may be formed, the third passivation layer 124 may be formed, the second seed layer 130 and the UBM 132 may be formed, and the contact bump 134 may be placed on the UBM 132 using the processes and materials similar to the processes and materials described above with respect to FIG. 1A. However, as one of ordinary skill in the art will recognize, the precise order and materials utilized for these components may be altered while still remaining within the scope of the present embodiments.

Figure 4B:
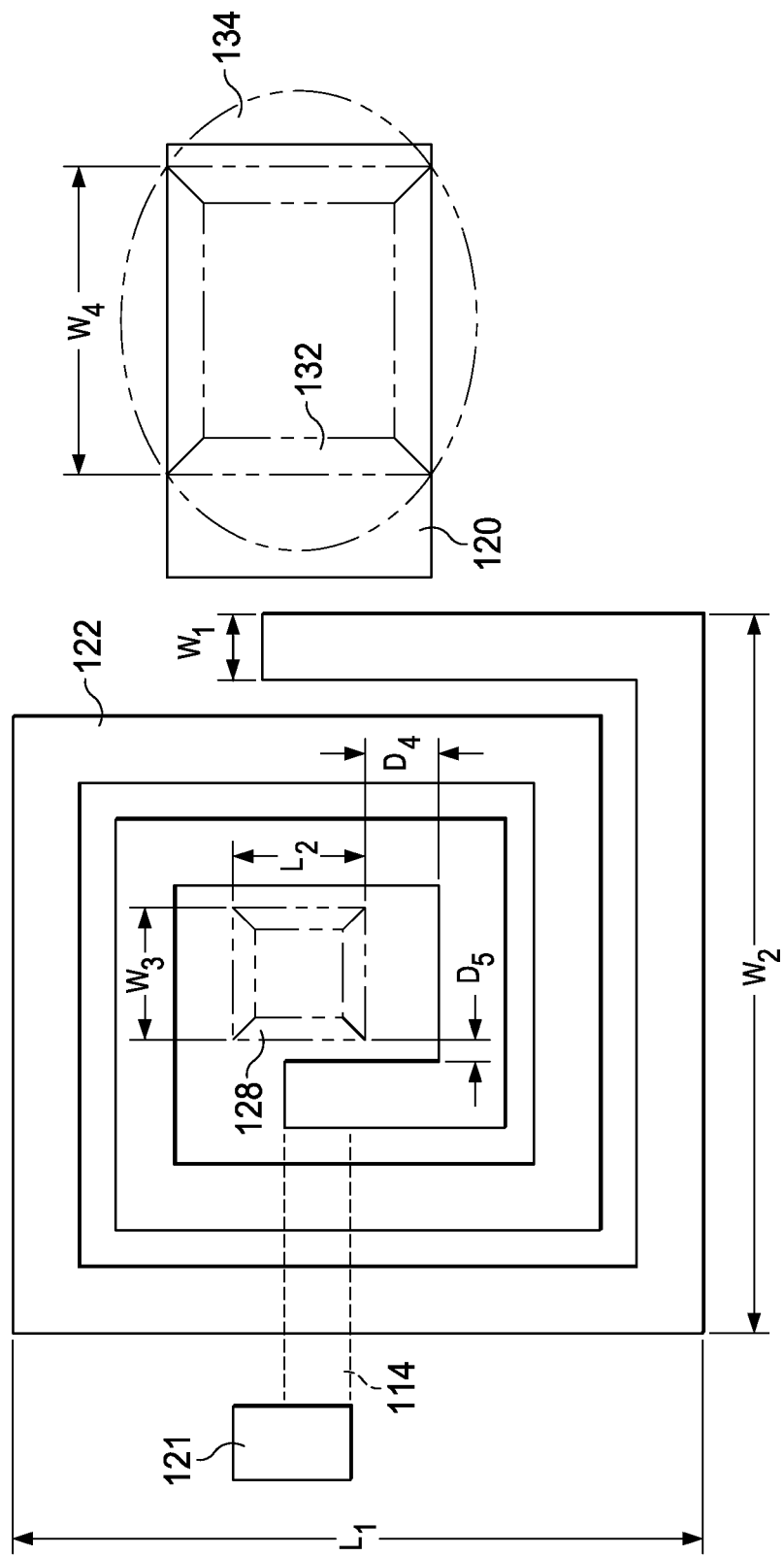
FIG. 4B illustrates a top-down view of the integrated inductor with the magnetic material located within the center of the integrated inductor in accordance with an embodiment.

FIG. 4B illustrates a top-down view of the embodiment in FIG. 4A, and illustrates the PPI 120, the inductor 122, the magnetic core 128, and the second interconnect 121 along the line D-D' in FIG. 4A. To illustrate the relative position of the components, the first interconnect 114, the UBM 132, and the contact bump 134 are also shown in dashed lines even though they are not along the line D-D' in FIG. 4A. As can be seen in this Figure, the magnetic core 128 may be located in the same plane as the inductor 122 and in a different plane than the UBM 132 (as indicated by the solid lines for the inductor 122 and the magnetic core 128 and the dashed lines for the UBM 132), and may have the third width $W_3$, which may be smaller than the fourth width $W_4$ of the UBM 132. Additionally, the magnetic core 128 may be separated from the inductor 122 by the fourth distance $D_4$ in a first direction and the fifth distance $D_5$ in a second direction.

By forming the magnetic core opening 125 and the magnetic core 128 extending into the second passivation layer 118, the magnetic core 128 may be placed within the same plane as the inductor 122. Additionally, this placement forms the magnetic core 128 not only within the central core region 123 but also within the center of the inductor 122. However, in this embodiment both the magnetic core 128 as well as the inductor 122 are protected from environmental and other hazards by the third passivation layer 124.

In accordance with an embodiment a semiconductor device comprising a conductive line over a semiconductor substrate is provided. The conductive line is a spiral, and a magnetic material is in a central region of the spiral.

In accordance with another embodiment a semiconductor device comprising a magnetic material located in a first region over a semiconductor substrate, the magnetic material comprising a first material, is provided. An underbump metallization is over the semiconductor substrate and has at least a portion aligned with the magnetic material, the underbump metallization comprising the first material. An inductor at least partially encircling the first region.

In accordance with yet another embodiment, a method comprising forming an inductor over a substrate and forming a magnetic material within the inductor, the magnetic material comprising a first material, is provided. A first underbump metallization is formed comprising the first material.

Although the embodiments and their advantages have been described in detail, it should be understood that various changes, substitutions and alterations can be made herein without departing from the spirit and scope of the embodiments as defined by the appended claims. For example, the size and material of the magnetic core may be changed as well as the overall size of the inductor may be changed.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
    a conductive line over a semiconductor substrate, the conductive line being a spiral;
    a magnetic material in a central region of the spiral;
    a first underbump metallization over the semiconductor substrate, wherein the magnetic material and the first underbump metallization have the same first composition of materials and wherein a top surface of the first underbump metallization is at least partially planar with a top surface of the magnetic material;
    a first seed layer between the magnetic material and the conductive line, wherein the first seed layer has a first side perpendicular with the semiconductor substrate, a second side perpendicular with the semiconductor substrate, and a third side extending from the first side to the second side, wherein the third side faces the semiconductor substrate and is in physical contact with only dielectric material;

a second seed layer between the first underbump metallization and the substrate, wherein the second seed layer and the first seed layer have the same second composition of materials; and an external bump in physical connection with the top surface of the first underbump metallization.

2. The semiconductor device of claim 1, wherein the magnetic material is located in a center of the spiral.

3. The semiconductor device of claim 2, the first underbump metallization being located in a plane with the magnetic material.

4. The semiconductor device of claim 3, wherein the first underbump metallization has a first width that is larger than a second width of the magnetic material.

5. The semiconductor device of claim 3, wherein the conductive line is located in the plane with the magnetic material.

6. The semiconductor device of claim 1, wherein the magnetic material has a non-planar top surface.

7. The semiconductor device of claim 1, wherein the magnetic material comprises a planar top surface.

8. The semiconductor device of claim 1, wherein the magnetic material is vertically offset from the center of the spiral.

9. A semiconductor device comprising:
a magnetic material located in a first region over a semiconductor substrate, the magnetic material comprising a first material;
an underbump metallization over the semiconductor substrate, wherein the underbump metallization has a top surface that is in a same plane as a top surface of the magnetic material, the underbump metallization comprising the first material at a same composition as the magnetic material;
an inductor at least partially encircling the first region, wherein the magnetic material is entirely separated from the inductor by dielectric material, wherein the dielectric material prevents all current flow through the magnetic material; and
a conductive bump in physical contact with the underbump metallization.

10. The semiconductor device of claim 9, wherein the magnetic material has a first width and the underbump metallization has a second width that is greater than the first width.

11. The semiconductor device of claim 9, wherein the semiconductor substrate further comprises a passivation layer in contact with the magnetic material.

12. The semiconductor device of claim 11, wherein the magnetic material extends into the passivation layer.

13. The semiconductor device of claim 11, wherein the magnetic material extends along a planar top surface of the passivation layer.

14. The semiconductor device of claim 9, wherein the inductor is aligned with at least a portion of the magnetic material.

15. A semiconductor device comprising:
an inductor over a substrate, the inductor comprising:
a spiral conductive line, the spiral conductive line encircling a first region; and
a magnetic material located in the first region over a first seed layer, the magnetic material having a first composition of a material and wherein the magnetic material is detached from the inductor and surrounded by dielectric material, wherein all surfaces of the first seed layer facing the substrate are completely covered by the dielectric material;
an underbump metallization over the substrate, the underbump metallization having the first composition of the material, wherein the underbump metallization has an upper surface that is at least partially planar with an upper surface of the magnetic material; and
a solder bump in physical contact with a portion of the underbump metallization with the first composition of the material.

16. The semiconductor device of claim 15, wherein the spiral conductive line has a center and the magnetic material is vertically offset from the center.

17. The semiconductor device of claim 15, wherein the underbump metallization is located in a plane with the magnetic material.

18. The semiconductor device of claim 15, wherein the underbump metallization has a first width that is larger than a second width of the magnetic material.

19. The semiconductor device of claim 15, wherein the magnetic material has a non-planar top surface.

* * * * *